United States Patent [19]
Kraus et al.

[11] Patent Number: 5,229,710
[45] Date of Patent: Jul. 20, 1993

[54] CMOS BAND GAP REFERENCE CIRCUIT

[75] Inventors: Rainer Kraus, Munich; Kurt Hoffmann, Taufkirchen, both of Fed. Rep. of Germany

[73] Assignee: Siemens Aktiengesellschaft, Munich, Fed. Rep. of Germany

[21] Appl. No.: 769,200

[22] Filed: Sep. 30, 1991

[30] Foreign Application Priority Data

Apr. 5, 1991 [DE] Fed. Rep. of Germany ....... 4111103

[51] Int. Cl.⁵ .............................................. G05F 3/30
[52] U.S. Cl. .................................. 323/313; 307/296.1; 307/296.6
[58] Field of Search ............... 323/313, 314, 315, 316; 307/296.1, 296.5, 296.6, 296.7, 296.8

[56] References Cited

U.S. PATENT DOCUMENTS 4,263,519 4/1981 Schade, Jr. ...................... 323/314 X

OTHER PUBLICATIONS

A Low-Voltage CMOS Bandage Reference, Eric A. Vihoz & Olivier Neyroud, IEEE Journal of Solid-State Circuits, vol. SC 14, No. 3, Jun. 1979, pp. 573-577.
Publication Tietze-Schenk, "Halbleiter-Schaltungstechnik", (Electronic Circuits), 7th Ad., 1985, pp. 534-537.

Primary Examiner—Emanuel T. Voeltz
Attorney, Agent, or Firm—Herbert L. Lerner; Laurence A. Greenberg

[57] ABSTRACT

A band gap reference circuit configuration includes first and second bipolar transistors having base-to-emitter voltages. An emitter resistor is connected to the first bipolar transistor. An operational amplifier is connected to the bipolar transistors for processing a difference generated between the base-to-emitter voltages of the first and second bipolar transistors to generate a largely temperature-independent reference voltage. The bipolar transistors are parasitic transistors, and the operational amplifier is constructed in MOS technology.

9 Claims, 3 Drawing Sheets

CMOS BAND GAP REFERENCE CIRCUIT

The invention relates to a band gap reference circuit configuration, which includes a first bipolar transistor with an emitter resistor and a second bipolar transistor, and in which a difference between the base-to-emitter voltages of the two bipolar transistors is generated and processed with the aid of an operational amplifier in order to generate a largely temperature-independent reference voltage.

Reference voltages are needed for many kinds of applications. In accordance with their function, the properties of the overall circuit depend on the properties of the reference voltages. An essential requirement of reference voltage sources is therefore that they be independent of temperature. Very accurate and virtually temperature-independent reference voltages can be generated with the aid of so-called band gap circuits. In principle, a band gap circuit uses the base-to-emitter voltage of a transistor as a reference, having a negative temperature coefficient to which a voltage with a positive temperature coefficient is added for compensation. To this end, given two transistors operated with different currents, a difference between the base-to-emitter voltages of the transistors is formed.

Band gap reference circuit configurations of the type discussed above are known, for instance, from the book by Tietze and Schenk entitled "Halbleiter-Schaltungstechnik" [Electronic Circuits], published by Springer Verlag in Berlin, 7th Edition, 1985, pages 534–537. The band gap circuits described therein use an operation amplifier having an output which is fed back to the actual band gap circuit. In principle, band gap references can be operated at low voltage, which in an extreme case is equal to the band gap voltage, or approximately 1.2 V for silicon.

Since the principle of the band gap circuit is based on compensation of the temperature dependency of the base-to-emitter voltage of a bipolar transistor, bipolar technology is typically necessary to achieve that kind of circuit. Problems arise whenever band gap reference circuits are to be used in MOS or complementary MOS circuits. That not only requires the MOS or CMOS technology necessary for such circuits, but bipolar process steps as well.

It is accordingly an object of the invention to provide a CMOS band gap reference circuit, which overcomes the hereinafore-mentioned disadvantages of the heretofore-known devices of this general type and which can be achieved by CMOS technology without additional bipolar process steps.

With the foregoing and other objects in view there is provided, in accordance with the invention, a band gap reference circuit configuration, comprising first and second bipolar transistors having base-to-emitter voltages, an emitter resistor connected to the first bipolar transistor, and an operational amplifier connected to the bipolar transistors for processing a difference generated between the base-to-emitter voltages of the first and second bipolar transistors to generate a largely temperature-independent reference voltage, the bipolar transistors being parasitic transistors, and the operational amplifier being constructed in MOS technology.

An advantage of the invention is that a band gap reference circuit can be made by a CMOS or MOS technology process without requiring additional process steps. Since only the bipolar transistors are constructed as parasitic transistors, it is possible to use components made by complementary MOS technology to process the resultant difference between the base-to-emitter voltages of these transistors. In this way, the circuit enjoys the known advantages of CMOS technology and of a largely temperature-independent reference voltage that is then furnished.

In accordance with another feature of the invention, there is provided a substrate zone forming a collector, an n-conductive well in complementary MOS technology forming a base, and a p-conductive diffusion zone in the n-conductive well forming an emitter, of one of the parasitic bipolar transistors.

In accordance with a further feature of the invention, there is provided at least one further parasitic bipolar transistor with which each of the first and second bipolar transistors are cascaded, the at least one further parasitic bipolar transistor having an emitter to which the base terminals of at least one of the first and second bipolar transistors are connected, and the at least one further parasitic bipolar transistor having a collector being jointly formed with the collectors of the first and second bipolar transistors by the substrate zone.

In accordance with an added feature of the invention, the at least one further parasitic bipolar transistor is a plurality of transistors combined to make a further bipolar transistor.

In accordance with an additional feature of the invention, there are provided parasitic bipolar compensation transistors each being connected to the input side of a respective one of the first and second bipolar transistors, each of the parasitic bipolar compensation transistors having a base connected to the emitter of the respective one of the first and second bipolar transistors.

In accordance with yet another feature of the invention, at least some of the bipolar transistors are each constructed by a parallel circuit of a plurality of parasitic bipolar transistors.

In accordance with yet a further feature of the invention, the operational amplifier has p-channel MOS transistors as input transistors and a p-channel MOS source follower as an output transistor.

In accordance with yet an added feature of the invention, there is provided a current generator for generating a reference current being reflected into each of the parasitic bipolar transistors, the current generator being controlled by the the operational amplifier.

In accordance with yet an additional feature of the invention, the two p-channel input transistors of the operational amplifier have a substrate terminal or well, and there is provided a high-impedance transistor connecting the substrate terminal or well to a supply potential, and a support capacitor connecting the substrate terminal or well to a reference potential.

In accordance with again another feature of the invention, there is provided a starting circuit with which the current generator can be activated with a starting pulse to be applied to a starting transistor of the starting circuit.

In accordance with again a further feature of the intention, the operational amplifier has complementary load transistors assigned to the input transistors, the input transistors and the complementary load transistors being largely symmetrical and having large geometric dimensions, the input transistors having a ratio of channel width to channel length of $>10$, and the complementary load transistors having a ratio of channel width to channel length of $>1$.

Other features which are considered as characteristic for the invention are set forth in the appended claims.

Although the invention is illustrated and described herein as embodied in a CMOS band gap reference circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
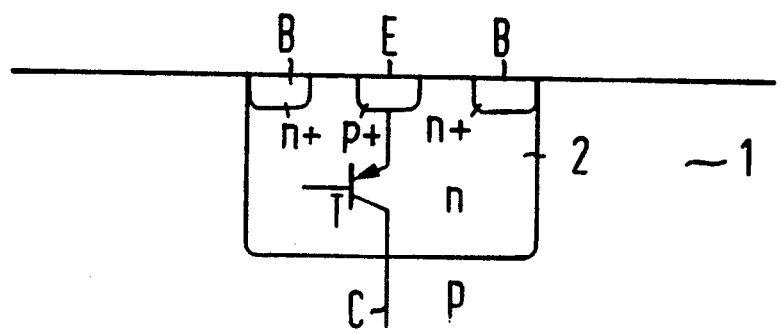
FIG. 1 is a fragmentary, diagrammatic and schematic view illustrating the principle of a vertical parasitic pnp bipolar transistor in an n-well CMOS process.

The exemplary embodiments illustrated in the drawings are limited to making a band gap voltage reference circuit by n-well or n-tub CMOS technology. However, it is immediately apparent that the invention is not restricted to such an embodiment. It can be made equally well by a p-well or p-tub CMOS process and by conventional MOS processes.

Referring now in detail to the figures of the drawing, in which identical elements are provided with the same reference numerals, and first, particularly, to FIG. 1 thereof, there is seen a parasitic bipolar transistor which is shown to illustrate the way in which it is created in an n-well CMOS process. An n-conductive well 2 is provided in a p-conductive semiconductor substrate 1. The well 2 includes a more heavily doped region E having p+ conduction and more heavily doped regions B having n+ conduction. In this kind of configuration, a parasitic vertical pnp bipolar transistor T is created, in which the p substrate 1 acts as a collector, the n-well 2 with the heavily doped regions B acts as a base, and the p+ diffusion region E acts as an emitter.

In the configuration of FIG. 1, the collector current of the parasitic pnp bipolar transistor flows into the substrate. High substrate currents are undesirable in principle in an integrated MOS circuit. However, in the case of the parasitic bipolar transistor of FIG. 1, the collector current flowing into the substrate is tolerable, since the collector currents for an entire integrated circuit can be limited to a few microamperes. A substrate bias voltage generator, of the kind already used in many integrated circuits, may possibly be necessary in order to pump the substrate to a negative voltage.

Figure 2:
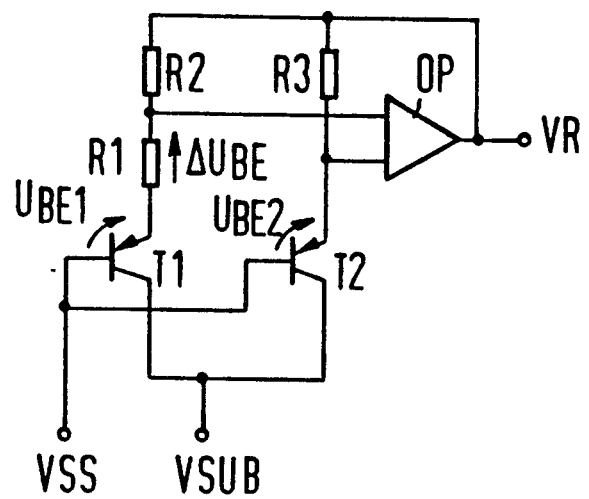
FIG. 2 is a basic schematic circuit diagram of a band gap circuit according to the invention.

The principle of the band gap reference circuit configuration according to the invention is illustrated by FIG. 2. Two parasitic bipolar transistors T1 and T2 made in accordance with the embodiment of FIG. 1 are connected by their base terminals to a reference potential VSS. The collectors of the transistor T1 and T2 are connected to one another, that is, to a substrate VSUB. Two series-connected resistors R1 and R2 are connected downstream of the emitter of the transistor T1.

A resistor R3 is connected downstream of the emitter of the transistor T2. The terminals of the resistors R2 and R3 that are remote or facing away from the emitters of the transistors T1 and T2, are connected to one another. The connecting point between the resistors R1 and R2 leads to one input of an operational amplifier OP, having another input which is located at the connecting point between the emitter of the transistor T2 and the resistor R3. The output of the operational amplifier OP is connected to a terminal VR and is fed back to the connecting point between the resistors R2 and R3. Like the resistors R1-R3, the operational amplifier OP is constructed in typical MOS or complementary MOS technology.

The known mode of operation of a band gap circuit according to FIG. 2 will be described below. The output voltage at the terminal VR of the operational amplifier OP is adjusted in such a way that the input voltage at the inputs of the operational amplifier OP becomes zero. A difference $\Delta U_{BE}$ between the base-to-emitter voltages $U_{BE2}$ of the transistor T2 and $U_{BE1}$ of the transistor T1 then drops at the emitter resistor R1 of the transistor T1. The reference voltage at the terminal VR is thus the product of the base-to-emitter voltage $U_{BE1}$ of the transistor T1 and the difference $\Delta U_{BE}$ between the base-to-emitter voltages of the bipolar transistors, multiplied by an amplification factor $1+R2/R1$. The difference $\Delta U_{BE}$ of the base-to-emitter voltages of the bipolar transistors is the product on one hand of a temperature voltage $kT/q$, multiplied by the natural logarithm of the product of the ratio between the collector currents of the transistors T2 and T1 and the ratio of the emitter areas of the transistors T1 and T2. The factor k is Boltzmann's constant; T is the absolute temperature; and q is the elementary charge.

The base-to-emitter voltage $U_{BE1}$ of the transistor T1 has a negative temperature coefficient. In contrast, the difference $\Delta U_{BE}$ between the base-to-emitter voltages has a positive temperature coefficient. The amplification factor $1+R2/R1$ determined by the resistance of the resistors R1 and R2 is selected in such a way that the positive and negative temperature coefficients compensate for one another. The reference voltage that arises at the terminal VR is then approximately as high as the band gap of silicon, for instance, or in other words approximately equal to 1.2 V.

If it is desired to limit the collector currents for the entire circuit to a few microamperes, as explained in conjunction with FIG. 1, then the collector current for each transistor is allowed to be approximately 1 μA. At this predetermined current and relative temperatures, the base-to-emitter voltage of the bipolar transistors is relatively low, or in other words on the order of magnitude of 500 mV. Voltages on this order of magnitude cannot be used as input levels of typical CMOS operational amplifiers without narrowing the functional range of the operational amplifier. However, coupling capacitors for coupling the base-to-emitter voltages to the inputs of the operational amplifier are often undesirable. In an advantageous embodiment of the invention shown schematically in FIG. 3, a simplification of the base-to-emitter voltages to be applied to the operational amplifier OP is therefore provided.

Figure 3:
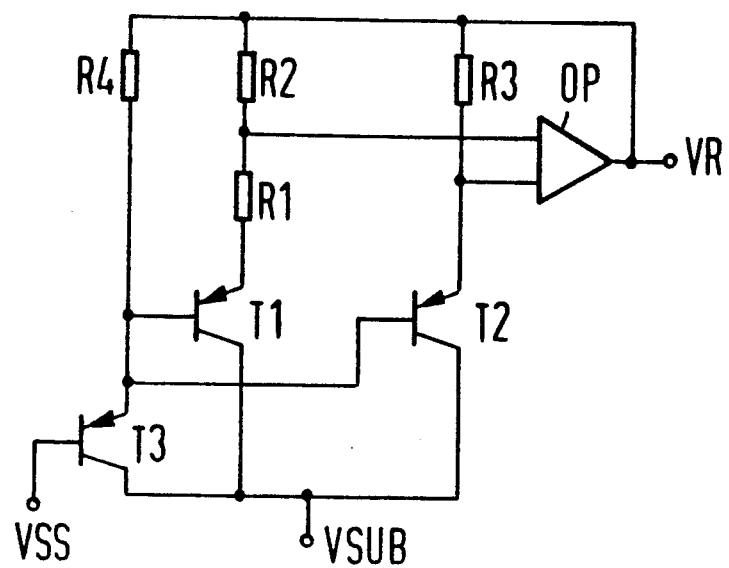
FIG. 3 is a basic circuit diagram of a band gap circuit according to the invention with cascaded bipolar transistors.

In the exemplary embodiment of FIG. 3, the voltages are doubled. To this end, in addition to the elements of a circuit as described in FIG. 2, a parasitic bipolar transistor T3 with an emitter resistor R4 is provided. The circuitry of the remaining elements will not be repeated for the sake of simplicity and only the differences will be described. Thus, in contrast to the exemplary embodiment of FIG. 2, the base terminals of the bipolar transistors T1 and T2 are not connected directly to the reference potential VSS. Instead, the base terminals of the two transistors T1 and T2 are connected to the emitter of the further bipolar transistor T3, the base of which is connected to the reference potential VSS and the collector of which is formed by the substrate or the substrate terminal VSUB. The connecting point between the emitter of the transistor T3 and the bases of the transistors T1 and T2 is connected to one terminal of the resistor R4, having another terminal which is connected to the common connecting point between the resistors R2, R3 and the terminal VR.

Doubling the input level for the operational amplifier OP in FIG. 3 is accordingly effected by cascading the bipolar transistors. Instead of providing one common transistor T3 as a cascade transistor for both the transistor T1 and the transistor T2 as in FIG. 3, it is naturally possible for there to be one cascade transistor with an associated emitter resistor for each of the transistors T1 and T2. The input levels of the operational amplifier OP can naturally be raised by means of further cascade transistors, in accordance with the number of cascaded transistors. The level doubling for the operational amplifier OP attained by means of two cascade transistors in FIG. 3 has the further effect of causing the temperature-compensated reference voltage at the terminal VR to be twice as high as in the embodiment of FIG. 2. At room temperature, the circuit of FIG. 3 therefore attains a reference voltage at the terminal VR of approximately 2.5 V.

As already explained in conjunction with FIG. 2, the difference in the base-to-emitter voltages of the bipolar transistors T2 and T1 depends on one hand on the ratio between the corresponding collector currents of these transistors and on the other on the reciprocal ratio of the emitter surface areas of the two transistors. Different collector currents can, for instance, be established by means of different collector resistors, that are not shown in FIGS. 2 and 3. However, it is simpler and more practical to attain the difference between the base-to-emitter voltage (at the same current) by selecting different emitter areas of the emitter transistors. It proves to be practical to make the emitter area of the transistor T1 approximately 10 times as large as the emitter area of the transistor T2. If each of the transistors T1 and T2 is assigned its own separate cascade transistor, having an emitter area ratio which is selected to match the emitter area ratio of the associated transistor T1 or T2 then the voltage difference is doubled, with a positive temperature coefficient. Greater emitter areas are attained, for instance, attained by constructing the emitter zone with a larger surface area, as explained with regard to FIG. 1, or by connecting a plurality of parasitic bipolar transistors parallel to one another.

Figure 4:
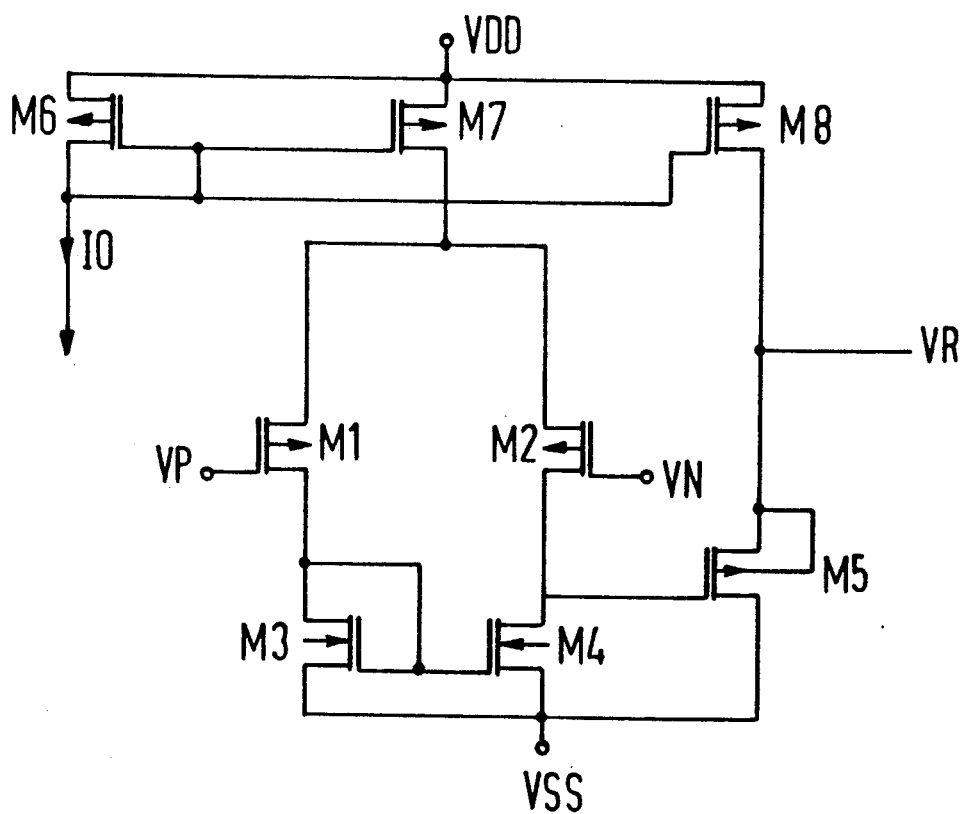
FIG. 4 is a basic circuit diagram of a CMOS operational amplifier that can be used in the circuit according to the invention.

FIG. 4 shows an exemplary embodiment of the operational amplifier OP. Transistors M1–M4 form the actual differential amplifier. The transistors M1 and M2 are input transistors, having gate terminals which are connected to terminals VP and VN. The gate terminal of the transistor M1 represents a non-inverting input, and the gate terminal of the transistor M2 represents an inverting input, of the operational amplifier. Source terminals of the p-channel transistors M1 and M2 are connected to one another and to one output terminal of a transistor M7, having another output terminal which is connected to a terminal VDD having a supply voltage potential. The transistor M7 forms a current source, having a current which is predetermined by a current mirror. The current mirror includes transistors M6 and M7 and the transistor M6 is connected as a diode. The source terminal of the p-channel transistor M6 is connected to the terminal VDD, and the gate terminal thereof is directly connected to the drain terminal thereof. The gate terminal of the transistor M6 is likewise connected to the gate terminal of the p-channel transistor M7.

Through the use of a wiring that is not shown in FIG. 4 but is familiar to one skilled in the art, an output current IO is established in the output circuit of the transistor M6. This current IO is reflected into the transistor M7 in accordance with the geometrical ratios of the transistors M6 and M7, so that it can supply the transistors M1 and M2. The drain terminals of the transistors M1 and M2 are respectively connected to the load transistors M3 and M4, which as shown in FIG. 4, are constructed as n-channel transistors in a current mirror circuit. To this end, the drain terminal of the transistor M1 is connected to the drain terminal of the transistor M3, and the gate terminals of the transistors M3 and M4 are interconnected. The drain terminals of the transistors M2 and M4 are connected directly to one another. The source terminals of the transistors M3 and M4 are connected jointly to one another and to a terminal VSS for the reference potential. The output of the differential amplifier is formed by the drain terminals of the transistors M2 and M4, having a common connecting point which is connected to the gate terminal of a transistor M5 that is connected as a source follower. To this end, the drain of the p-channel transistor M is connected to the terminal VSS and to the source terminals of the transistors M3 and M4, while the source of the transistor M5 is supplied from the output circuit of a p-channel transistor M8 that forms a current mirror with the transistor M6. To this end, the gate terminal of the transistor M8 is connected to the gate terminal of the transistor M6 and likewise to the gate terminal of the transistor M7, while the source terminal of the transistor M8 is connected to the terminal VDD. The connecting point between the drain terminal of the transistor M8 and the source terminal of the transistor M5 are connected to the terminal VR at which the reference potential is applied. For the sake of completeness, it is noted that the substrate or bulk terminal and the source terminal of the transistor M5 are connected to one another.

The p-channel transistors M1 and M2 are practical for the amplifier inputs of the operational amplifier, because of the low input levels. With the aid of the p-channel source follower transistor M5 connected to the output side, the output reference voltage of approximately 2.5 V is attained at the terminal VR. In principle, the circuit of FIG. 4 can be used in a circuit according to the invention. However, for optimal functioning some dimensioning guidelines should be observed. The bias current IO, which is generated in a way that is familiar to anyone skilled in the art, should thus be adjusted virtually completely independently of the supply voltage at the terminal VDD. In this way, rapid fluctuations in the supply voltage cannot affect the reference voltage at the terminal VR. Moreover, the magnitude of the current IO, which determines the magnitude of the current in the transistors M7 and M8, must be adapted to the circuit. The current through the transistor M8 must be adjusted by the selection of the current mirror ratio between the transistors M6 and M8, or the selection of the current IO, in such a way that it is at least as high as the sum of the emitter currents of the parasitic bipolar transistors. On the other hand, the current source currents must not lead to the destruction of the transistors.

In principle, the reference voltage at the terminal VR can be used for adjusting and controlling the bias current IO of the current source. Direct control, however, would result in a positive feedback for the entire circuit. A negative feedback, with which the configuration operates stably, can be attained by connecting an inverter stage to the output side of the operational amplifier. However, such an inverter stage requires provisions that prevent malfunctions in the supply voltage from affecting the reference voltage.

When dimensioning an operational amplifier according to FIG. in a circuit according to FIG. 3, care should be taken to ensure that the resistors R1-R4 have comparatively high impedance. Resistors attained in integrated circuits take up a relatively large area on the chip. For example, for the mega-ohm resistors required in accordance with FIG. 3, several centimeters of polysilicon paths are necessary.

Figure 5:
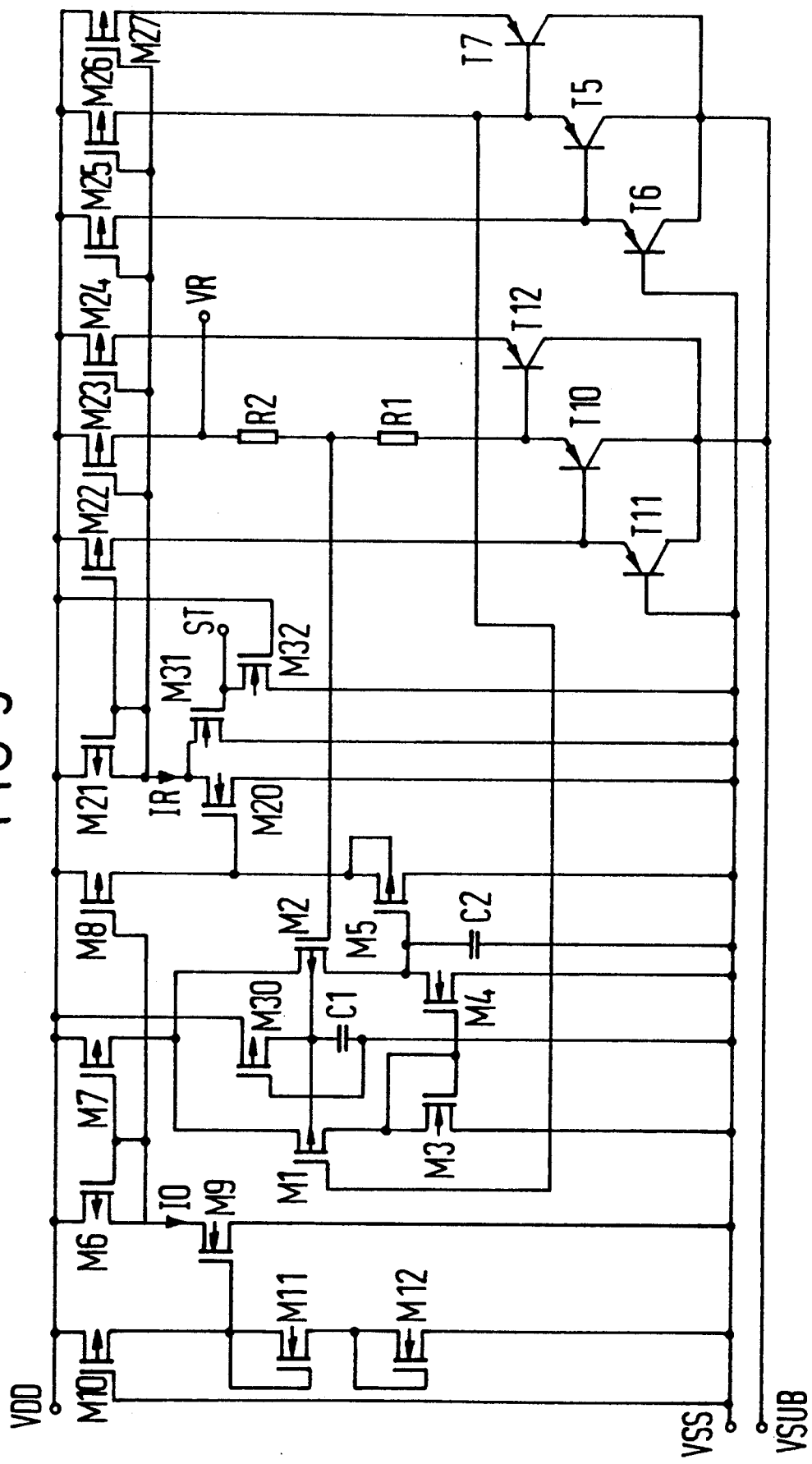
FIG. 5 is a basic circuit diagram of a complete band gap reference circuit according to the invention.

FIG. 5 shows a complete basic circuit diagram of a band gap reference circuit configuration or array according to the invention, which is optimized by taking the dimensioning requirements discussed above into account.

The operational amplifier includes the transistors M1-M8 as described in conjunction with FIG. 4. The gate terminals of the transistors M1 and M2, as inputs of the operational amplifier, are controlled by terminals of the parasitic bipolar transistor array. A first input voltage of the operational amplifier is generated with the aid of transistors T5 and T6, to which the transistors T2 and T3 of FIG. 3 are equivalent. The transistors T5 and T6 are cascaded. A second input voltage of the operational amplifier is generated with the aid of transistors T10 and T11, which are likewise cascaded in the manner of the transistors T1 and T3 of FIG. 3. The two series-connected resistors R1 and R2 are locate in the emitter circuit of the transistor T10. The connecting point between these two resistors is connected to the gate terminal of the transistor M2, while the emitter terminal of the transistor T5 is connected to the gate terminal of the transistor M1.

In the exemplary embodiment of FIG. 5, the emitter surface areas of the transistors T10 and T11 are each intended to be ten times as large as the emitter areas of the transistors T5 and T6. Naturally, other ratios may also be established. A further parasitic bipolar transistor T12 is assigned to the transistors T10 and T11, and a further parasitic bipolar transistor T7 is assigned to the transistors T5 and T6. The base terminal of the transistor T12 is located at the emitter of the transistor T10, and the base terminal of the transistor T7 is located at the emitter of the transistor T5. The collectors of the transistors T7 and T12 are connected jointly with the collectors of the other bipolar transistors to the substrate of the semiconductor wafer, which is symbolized by the terminal VSUB.

Currents are impressed on the emitters of the transistors T5-T7 and T10-T12 that are generated in FIG. 5 with the aid of a current mirror configuration including transistors M21-M27. The transistors of this current mirror circuit are constructed as p-channel MOS transistors. The source terminals of all of the transistors of the current mirror circuits are connected to the terminal VDD. The gate and drain terminals of the transistor M21 are connected directly to one another, and this coupling point is also carried to the gate terminals of the transistors M22-M27. Correspondingly, the drain terminals of the transistors M22-M27 feed the currents reflected into these transistors to the emitters of the transistors T5-T7, T11 and T12, as well as through the resistors R1 and R2 to the emitter of the transistor T10. The terminal VR with the temperature-independent reference voltage is located at the connecting point between the resistor R2 and the drain terminal of the transistor M23.

The current mirror circuit having the transistors M21-M27 is supplemented by a transistor M20 to make a current generator, which has a gate terminal that is controlled by the source follower transistor M5 of the operational amplifier. The output circuit of the n-channel MOS transistor M20 is connected in series with the output circuit of the transistor M21. To this end, the drain terminals of the two transistors are connected to one another, while the source terminal of the transistor M20 is connected to the reference potential VSS. A current IR therefore flows through the output circuits of transistors M20 and M21. In the embodiment of FIG. 5, the current mirror circuit having the transistors M21-M27 is dimensioned in such a way that each bipolar transistor is supplied with approximately the same current, which is equal to the current IR.

In the circuit of FIG. 5, resistors can be provided only in the form of ohmic resistors, because of the voltage divider including the resistors R1 and R2. This means that for integration, the circuit according to the invention needs only the minimum of two ohmic resistors, making for considerable economy in terms of chip surface area.

The use of six parasitic bipolar transistors offers additional advantages as compared with the embodiment of FIG. 3. It should be added that the transistor T12 has the same emitter surface area as the transistors T10 and T11. In other words, in this exemplary embodiment, it has ten times the emitter area of the transistors T5-T7. Suitably, each of the bipolar transistors T10-T12 is made from ten parallel-connected parasitic bipolar transistors.

As already mentioned, the base-to-emitter voltages of the parasitic bipolar transistors T10, T11 and T5, T6 are decisive for the function of the band gap reference circuit configuration. The base-to-emitter voltage of each of these transistors is jointly determined by its collector current. On the other hand, the collector current is equal to the difference between the emitter and base currents of the associated transistor. If the impressed current IR is equal to the emitter current of the transistor as assumed, then the influence of the base current of this transistor on the temperature behavior of the base-to-emitter voltage must be taken into account as well. Since the current amplification of bipolar transistors is quite low and is on the order of magnitude of 1, the base current is not negligible. The current amplification itself is highly temperature-dependent, and moreover it varies sharply in terms of quantity.

For this reason, the transistors T12 and T7 provide for compensation for the base currents of the transistors T10 and T5, respectively. In the configuration according to the invention shown in FIG. 5, the emitter current of the transistors T5, T6, T10 and T11 that are relevant to the band gap circuit is composed of the current IR, or the particular emitter currents generated by the current mirror circuit M21-M27, and the base current of each adjacent transistor. On the assumption that the emitter currents are equal to the impressed current IR, this means that the collector current of each transistor relevant to the band gap function is approximately equal to the impressed current IR, because the current amplifications of adjacent transistors do not deviate sharply from one another. For this reason, the base current flowing into the transistors has no influence on the temperature behavior of the respective base-to-emitter voltage.

It is accordingly true of the temperature-independent reference voltage at the terminal VR that its value is based on twice the base-to-emitter voltage of the transistor T11 or T11, by addition to the product of the reference current IR and the sum of the resistors R1 and R2.

In the embodiment of FIG. 5, the current according to the invention has no offset compensation, but naturally such offset compensation is within the scope of the invention. In FIG. 5, an offset of the operational amplifier has the effect of causing twice the difference between the base-to-emitter voltages of the bipolar transistors to be raised by the offset voltage, and this term is multiplied by the amplification factor 1+R2/R1. The reference voltage can accordingly deviate from the desired value. Since on the other hand twice the difference of the base-to-emitter voltages is used on the basis of the cascaded bipolar transistors, the necessary amplification factor 1+R2/R1 is only half as high as in a version in accordance with FIG. 2 that has only one difference between the base-to-emitter voltages available. For this reason, the deviations from the ideal reference voltage caused by the operational amplifier offset are reduced by half. If the reference voltage deviations from the ideal reference voltage caused by the amplifier offset should prove problematic, then naturally compensation for the amplifier offset can be provided by using known measures.

In the embodiment of FIG. 5, instead of a compensation for the amplifier offset, a minimization of this offset is attained by suitable dimensioning of the amplifier transistors. The four essential transistors M1-M4 of the operation amplifier have large geometric dimensions, so that geometric tolerances will have only slight effects on the transistor parameters. The ratio between channel width and channel length of the two input transistors M1 and M2, which are controlled by the bipolar transistor outputs, is preferably as high as possible because as a result, the offset components not caused by deviation in the temperature voltage are reduced thereby. Moreover, common mode rejection is improved. In contrast, for the current mirror transistors M3 and M4 in the load circuit of the input transistors M1 and M2, a low ratio between the channel width and channel length is advantageous, because this minimizes the influence of deviation in the temperature voltage upon the current. In any case, in this configuration the latitude for the transistors M3 and M4 is narrow, because if the ratio of the channel width to the channel length is reduced, the gate-to-source voltage required for the impressed current increases. That voltage must remain low, if the transistors M1 and M2 are to operate at saturation.

Based on the dimensioning guidelines described above, the ratio of channel width to channel length of the transistors M1 and M2 is preferably adjusted to approximately 20, while the corresponding ratio between the transistors M3 and M4 is adjusted to approximately one, and preferably approximately 10:9. The channel width of the transistors M1 or M2 may be about 200 $\mu$m, while the channel width of the transistors M3 or M4 may be about 20 $\mu$m, or in other words less by approximately a factor of 10.

The layout for the four amplifier transistors M1-M4 will preferably be made as symmetrical as possible. It may prove to be practical to make each of the transistors from two parallel-connected transistors, each of which is disposed diagonally offset and is intended to be wired crosswise. In this way, locally dependent variations in parameters can be compensated for by averaging.

In the embodiment of FIG. 5, the bias current IO for the operational amplifier is uncritical, because the amplifier output is then capacitively loaded only by the transistor M20. For this reason, the current IO to be reflected into th transistors M7 and M8 is generated with the aid of transistors M6 and M9, which have output circuits that are connected in series. The source of the n-channel transistor M9 is connected to the terminal VSS for the reference potential an the gate terminal thereof is connected to the input of a voltage divider. This voltage divider is formed by transistors M10-M12, which have output circuits that are connected in series. The n-channel MOS transistors M11 and M12 are connected as diodes, and the gate terminal of the p-channel transistor M10 is connected to the terminal VSS. The connecting point between the output circuits of the transistors M10 and M11 controls the gate of the transistor M9.

Based on the transistor characteristics, there is still an absolute permissible upper limit value for the bias current IO, while in principle the current on the other side can become arbitrarily low. The lower the bias current IO, the more the switching speed of the operational amplifier decreases. Since temperature changes on the other hand do not proceed very quickly, the demands for adjustment speed are low. For the current IO, a value results that is approximately equivalent to half the current amplification factor of the transistor M9, multiplied by the square of the operating voltage of MOS transistors. The transistors for the current generator of the bias current IO are suitably dimensioned in such a way that changes in the supply voltage at the terminal VDD then have only a negligible influence. Depending on structural parameters for the circuit according to the invention, the current IO is approximately 1 $\mu$A.

The substrate or bulk terminal, or in other words the well of the transistors M1 and M2, can be connected to the source terminals of these transistors. However, in the exemplary embodiment of FIG. 5, the substrate terminal of both transistors is applied to the supply potential of the terminal VDD, because the resultant increase in the operating voltage has an advantageous effect on the function of the operational amplifier. Stated in concrete terms, a p-channel MOS transistor M30 is provided, having a source connected to the terminal VDD, a drain connected to the substrate terminals of the transistors M1 and M2, and a gate terminal connected to the terminal VSS having the reference potential. A capacitor C1 is also connected between the common connecting point between the substrate terminals of the transistors M1 and M2 and the drain terminal of the transistor M30 on one hand, and the terminal VSS on the other hand. The transistor M30 is constructed as a high-impedance transistor, and the capacitor C1 is on the order of magnitude of 10 pF and is implemented as an additional supporting capacitor. By combining the transistor M30 with the capacitor C1, the voltage at the common substrate connection node of the transistors M1 and M2 only varies slowly. Joining this node to the terminal VDD, which leads to an increase in the operating voltage of the transistors M1 and M2, makes greater level rises possible at the drain nodes of transistors M1 and M2, without causing these transistors to leave their saturation range.

In FIG. 5, the common connecting point between the drain terminals of the transistors M2 and M4 and the gate terminal of the transistor M5, which forms the output of the operational amplifier, is connected to the terminal VSS through a capacitor C2. This capacitor has the task of suppressing any possible tendency toward oscillation resulting from possible feedback.

Finally, two further transistors M31 and M32 are provided, which are of the n-channel MOS type and have source terminals located at the terminal VSS. The drain terminal of the transistor M31 is connected to the connecting point between the drain terminals of the transistors M20 and M21, while the gate terminal of the transistor M31 is connected to a terminal ST and to the drain terminal of the transistor M32. The gate terminal of the transistor M32 is located at the terminal VDD. The two transistors M31 and M32 are provided for the case where the circuit configuration according to the invention, upon application of the supply voltage to the terminal VDD, does not reach the steady operating state on its own, because of unfavorable starting conditions. In that case, a brief pulse at the terminal ST activates the circuit according to the invention as shown in FIG. 5.

In an actual embodiment, the two resistors R1 and R2 require the most chip area. They can be made, for instance, from paths of polysilicon being 1.5 $\mu$m in width and 36,000 $\mu$m in length overall. It is possible to combine a plurality of p-channel MOS transistors in a common well. On the set of conditions that the transistors T10–T12 have ten times the emitter area of the transistors T5–T7, and that the amplification factor 1+R2/R1 of the circuit is selected to be equal to 10, a straight line dropping linearly with the temperature results for the base-to-emitter voltages of the transistors T10 and T11, while a straight line rising linearly with temperature results for the difference between the base-to-emitter voltages of the two parasitic bipolar transistor configurations. The compensation of both temperature dependencies is very good, and the result is a constant reference voltage on the order of magnitude of 2.55 V that is independent of temperature.

The deviations from the ideal value of the reference voltage because of the amplifier offset that is not compensated for, as shown in FIG. 5, are less than ±50 mV. Slow changes in the supply voltage in the range from 4 V to 6 V have no influence on the reference voltage. Upon rapid fluctuations in the supply voltage at the terminal VDD, a slight disturbance arises, which occurs above all upon periodic fluctuations. However, this disturbance is less than 20 mV, if the supply voltage fluctuates by 1 V. The current consumption of a circuit according to the invention as shown in FIG. 5 is approximately 10 to 12 $\mu$A, of which approximately 5 to 6 $\mu$A flow through the bipolar transistors into the substrate.

Even if the substrate is pumped to negative voltage with the aid of a substrate bias voltage generator, this substrate current is acceptable.

We claim:

1. A MOS band gap reference circuit configuration formed in a monolithic substrate, comprising first and second parasitic bipolar transistors having base-to-emitter voltages, an emitter resistor connected to said first parasitic bipolar transistor, and an operational amplifier connected to respective emitters of said parasitic bipolar transistors for processing a difference generated between the base-to-emitter voltages of said first and second bipolar transistors to generate a largely temperature-independent reference voltage, a substrate zone forming a collector, an n-conductive well in complementary MOS technology forming a base, and a p-conductive diffusing zone in the n-conductive well forming an emitter, of one of said parasitic bipolar transistors, and including at least one further parasitic bipolar transistor with which each of said first and second bipolar transistors are cascaded, said at least one further parasitic bipolar transistor having an emitter to which the base terminals of at least one of said first and second bipolar transistors are connected, and said at least one further parasitic bipolar transistor having a collector being jointly formed with the collectors of said first and second bipolar transistors by the substrate zone.

2. The configuration according to claim 1, wherein said at least one further parasitic bipolar transistor is a plurality of transistors combined to make a further bipolar transistor.

3. The configuration of one according to claim 1, including parasitic bipolar compensation transistors each being connected to the input side of a respective one of said first and second bipolar transistors, each of said parasitic bipolar compensation transistors having a base connected to the emitter of said respective one of said first and second bipolar transistors.

4. The configuration according to claim 1, wherein at least some of said bipolar transistors are each constructed by a parallel circuit of a plurality of parasitic bipolar transistors.

5. The configuration according to claim 1, wherein said operational amplifier has p-channel MOS transistors as input transistors and a p-channel MOS source follower as an output transistor.

6. The configuration according to claim 5, including a current generator for generating a reference current being reflected into each of said parasitic bipolar transistors, said current generator being controlled by said operational amplifier.

7. The configuration according to claim 5, wherein said two p-channel input transistors of said operational amplifier have a substrate terminal or well, and including a high-impedance transistor connecting the substrate terminal or well to a supply potential, and a support capacitor connecting the substrate terminal or well to a reference potential.

8. The configuration according to claim 6, including a starting circuit with which said current generator can be activated with a starting pulse to be applied to a starting transistor of said starting circuit.

9. The configuration according to claim 5, wherein said operational amplifier has complementary load transistors assigned to said input transistors, said input transistors and said complementary load transistors being largely symmetrical and having large geometric dimensions, said input transistors having a ratio of channel width to channel length of >10, and said complementary load transistors having a ratio of channel width to channel length of >1.

* * * * *